United States Patent
Morito

(10) Patent No.: US 7,130,112 B2
(45) Date of Patent: Oct. 31, 2006

(54) OPTICAL AMPLIFYING DEVICE

(75) Inventor: Ken Morito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/959,507

(22) Filed: Oct. 7, 2004

(65) Prior Publication Data

US 2005/0063042 A1   Mar. 24, 2005

Related U.S. Application Data

(63) Continuation of application No. PCT/JP03/05675, filed on May 7, 2003.

(30) Foreign Application Priority Data

May 9, 2002   (JP) ............................. 2002-133846

(51) Int. Cl.
   *H01S 3/00*   (2006.01)
(52) U.S. Cl. ...................... 359/344; 359/349
(58) Field of Classification Search ................ 359/344, 359/349

See application file for complete search history.

(56) References Cited

U.S. PATENT DOCUMENTS

| | | | |
|---|---|---|---|
| 5,025,142 A | 6/1991 | Aoshima et al. | 250/201.9 |
| 5,388,117 A | 2/1995 | Nishimura | 372/45 |
| 5,633,750 A * | 5/1997 | Nogiwa et al. | 359/341.41 |
| 6,061,481 A * | 5/2000 | Heidrich et al. | 385/14 |
| 6,122,419 A * | 9/2000 | Kurokawa et al. | 385/31 |
| 6,208,454 B1 | 3/2001 | Koren et al. | 359/344 |
| 6,487,007 B1 | 11/2002 | Morito | 359/344 |
| 6,487,008 B1 * | 11/2002 | Morito | 359/344 |
| 6,522,462 B1 * | 2/2003 | Chu et al. | 359/344 |
| 6,570,697 B1 * | 5/2003 | Martinez et al. | 359/238 |
| 6,608,854 B1 * | 8/2003 | Watanabe | 372/96 |
| 6,678,086 B1 * | 1/2004 | Dave et al. | 359/326 |
| 6,751,002 B1 * | 6/2004 | Ovadia et al. | 359/246 |
| 6,753,996 B1 * | 6/2004 | Shibata et al. | 359/279 |
| 6,768,827 B1 * | 7/2004 | Yoo | 385/14 |
| 6,771,847 B1 * | 8/2004 | Mukai | 385/14 |
| 6,810,407 B1 * | 10/2004 | Jaques et al. | 708/801 |
| 6,992,813 B1 * | 1/2006 | Tanaka et al. | 359/333 |
| 2002/0101293 A1 * | 8/2002 | Shibata et al. | 332/112 |
| 2002/0122245 A1 * | 9/2002 | Morito | 359/344 |

(Continued)

FOREIGN PATENT DOCUMENTS

EP          0 753 944 A1   1/1997

(Continued)

OTHER PUBLICATIONS

Holtmann C et al: "Monolithically Integrated Gain-clamped Semiconductor Optical Amplifier Exploiting Mach-zehnder Interferometer Configuration", *European Conference on Opt. Comm.-Proceedings*, vol. 3, Sep. 1996, pp. 199-202.

*Primary Examiner*—Deandra M. Hughes
(74) *Attorney, Agent, or Firm*—Armstrong, Kratz, Quintos, Hanson & Brooks, LLP

(57) ABSTRACT

The optical amplifying device comprises a DFB laser 22 formed on an n type InP substrate 10, for outputting control light; a symmetrical Mach-Zehnder interferometer 12 formed on the n type InP substrate 10 and including 3 dB optical couplers 14, 16 having 2 input ports and 2 output ports, and optical waveguides 24a, 24b which optically interconnect the output port of the 3 dB optical coupler 14 and the input port of the 3 dB optical coupler 16; and SOAs 24a, 24b respectively formed in the optical waveguides 24a, 24b.

16 Claims, 13 Drawing Sheets

U.S. PATENT DOCUMENTS

| | | | |
|---|---|---|---|
| 2003/0002117 A1* | 1/2003 | Naik et al. ................. | 359/179 |
| 2003/0067678 A1 | 4/2003 | Shibata et al. ............ | 359/344 |
| 2004/0071380 A1* | 4/2004 | Wiesmann et al. .......... | 385/1 |
| 2006/0008203 A1* | 1/2006 | Maeda ...................... | 385/27 |

FOREIGN PATENT DOCUMENTS

| | | |
|---|---|---|
| EP | 1 300 918 A2 | 4/2003 |
| JP | 01-298824 | 12/1989 |
| JP | 02-36581 | 2/1990 |
| JP | 06-244508 | 9/1994 |
| JP | 2000-10136 | 1/2000 |
| JP | 2000-12978 | 1/2000 |
| JP | 2000-258811 | 9/2000 |
| JP | 2001-53392 | 2/2001 |
| JP | 2002-6352 | 1/2002 |
| JP | 2002-208758 | 7/2002 |
| JP | 2003-179289 | 6/2003 |
| JP | 2003-186067 | 7/2003 |

\* cited by examiner

US 7,130,112 B2

OPTICAL AMPLIFYING DEVICE

CROSS REFERENCE TO RELATED APPLICATIONS

This application is a Continuation of International Application No. PCT/JP03/05675, with an international filing date of May 7, 2003, which designated the United States.

TECHNICAL FIELD

The present invention relates to an optical amplifying device using a semiconductor optical amplifier, more specifically to an optical amplifying device having a function of controlling a level/power of an output signal light to be constant (ALC: Auto Level Control, APC: Auto Power Control).

BACKGROUND ART

For the recent drastic communication demand increase, wavelength division multiplex (WDM) communication systems which multiplex a plurality of light signals of different wavelengths to thereby transmit a large capacity of information by one optical fiber are being developed. Such WDM communication systems utilize a number of optical parts for multiplexing and demultiplexing signal light, and signal light is attenuated due to light losses in the respective optical parts.

To compensate such light losses, optical amplifying devices are used. The WDM communication system requires a much larger number of optical amplifying devices than the conventional optical fiber communication system. The optical amplifying devices used in the WDM communication system must be small-sized and can operate at small power consumption.

Furthermore, such optical amplifying devices must have large input dynamic ranges so as to meet large power level changes of input light signals and must have a function of controlling levels/powers of output light signals to be constant.

Among various light amplifiers, semiconductor optical amplifiers (SOAs) are small-sized and have low power consumption, and are expected to be optical amplifiers for the light loss compensation, which are used in the WDM communication systems.

The inventor of the present application has proposed an optical amplifying device using an SOA having a function of controlling a level/power of output signal light to be constant by injecting external light (refer to Patent Reference 1). The optical amplifying device using the conventional SOA having the function of controlling a level/power of output signal light to be constant by injecting external light will be explained with reference to FIG. 13. FIG. 13 is a block diagram of the conventional optical amplifying device having the function of controlling a light output level to be constant, which shows a structure thereof.

A light source for control light 102 is connected to one input port of a wavelength division multiplexing (WDM) coupler 100 which multiplexes signal light and control light. Signal light to be amplified is inputted to the other input port of the WDM coupler 100. An SOA 104 which amplifies signal light multiplexed with control light by the WDM coupler 100 is connected to the output port of the WDM coupler 100. An optical filter 106 which separates amplified signal light from control light is disposed on the output side of the SOA 104.

In addition, an optical divider 108 for branching a part of the signal light outputted from the optical filter 106 is disposed on the output side of the optical filter 106. A power meter 110 which measures the output of the branched signal light is connected to one output port of the optical divider 108. The power meter 110 is connected to a control unit 112 for controlling a light level of control light, based on the measured result of the output of the signal light.

Based on the measured result of an output of the signal light given by the power meter 110, a light level of control light which is to be coupled with the signal light to be inputted to the SOA 104 is controlled, whereby the amplification factor of the signal light to be amplified by the SOA 104 can be controlled.

However, discrete modules, in which the optical input/output is achieved by using optical fibers, are used for the respective constituent elements of the conventional optical amplifying device shown in FIG. 13. Each module is as large as several centimeters, and an about 10-cm square space is required for the whole optical amplifying device. Accordingly, its size is a disadvantage in using the optical amplifying device of the WDM communication system.

The conventional optical amplifying device shown in FIG. 13 includes a number of lenses, isolators and Peltier devices, which disadvantageously results in high costs. That is, generally, the light source for control light 102 requires 2 lenses, 1 isolator and 1 Peltier device; the SOA 104 requires 4 lenses, 2 isolators and 1 Peltier device; the WDM coupler 100 requires 2 lenses; and the filter requires 2 lenses. The optical amplifying device as a whole requires 10 lenses, 3 isolators and 2 Peltier devices. Thus, the conventional optical amplifying device having the function of controlling light output levels has a large number of the required optical parts, which makes the optical amplifying device expensive.

Furthermore, the step of mounting the modules constituting the optical amplifying device takes much work, which is one factor for high costs.

An object of the present invention is to provide an optical amplifying device having the function of controlling light output levels, which is small-sized, includes a small number of necessary optical parts and does not require a complicated mounting step.

Patent Reference 1

Japanese Patent Application Unexamined Publication No. 2000-208758

DISCLOSURE OF INVENTION

The above-described object is achieved by an optical amplifying device for controlling an amplification factor of signal light by using control light, comprising: a light source for control light formed on a semiconductor substrate, for outputting the control light; a coupling part formed on the semiconductor substrate, for coupling the signal light and the control light; a semiconductor optical amplifier formed on the semiconductor substrate, for amplifying the signal light coupled with the control light; and a separating part formed on the semiconductor substrate, for separating the signal light amplified by the semiconductor optical amplifier from the control light to output the amplified signal light.

The above-described object is also achieved by an optical amplifying device comprising: a Mach-Zehnder interferometer formed on a semiconductor substrate, and including a first 3 dB optical coupler and a second 3 dB optical coupler each having 2 input ports and 2 output ports, and a first optical waveguide and a second optical waveguide optically interconnecting the output ports of the first 3 dB optical coupler and the input ports of the second 3 dB optical coupler; semiconductor optical amplifiers respectively formed in the first and the second optical waveguides; a light source for control light formed on the semiconductor substrate, for inputting into the Mach-Zehnder interferometer control light for controlling an amplification factor for signal light inputted into one input port of the first 3 dB optical coupler.

According to the present invention, the optical amplifying device for controlling an amplification factor of signal light by using control light comprises a coupling part formed on the semiconductor substrate, for coupling the signal light and the control light, a semiconductor optical amplifier formed on the semiconductor substrate, for amplifying the signal light coupled with the control light, and a separating part formed on the semiconductor substrate, for separating the signal light amplified by the semiconductor optical amplifier from the control light to output the amplified signal light, whereby the optical amplifying device according to the present invention can be smaller-sized in comparison with the conventional optical amplifying device. A number of the necessary optical parts can be small, and the optical amplifying device according to the present invention can be fabricated by the steps equivalent to those of forming SOAs, which makes complicated mounting steps unnecessary, whereby the optical amplifying device having the function of controlling light output levels can be provided inexpensively.

According to the present invention, signal light and control light are inputted into the semiconductor optical amplifier in the directions opposite to each other so as to be coupled to be amplified, and the signal light and the control light which have propagated in the semiconductor amplifiers in the directions opposite to each other are separated from each other, whereby the generation of the phase conjugate waves due to the four wave mixing can be prevented without increasing the size of the device and the cost. The wavelength of the control light can be set with high freedom degree, whereby the wavelength of the control light can be set so that sufficient gain saturation can be obtained with low power, and the optical amplifying device can have low electric power consumption.

BEST MODE FOR CARRYING OUT THE INVENTION (A First Embodiment)

The optical amplifying device according to a first embodiment of the present invention and the method for fabricating the optical amplifying device will be explained with reference to FIGS. 1 to 5. FIG. 1 is diagrammatic views of the semiconductor device according to the present embodiment, which show a structure thereof. FIGS. 2 to 5 are sectional views of the optical amplifying device according to the present embodiment in the steps of the method for fabricating the optical amplifying device, which show the method.

(Optical Amplifying Device)

Figure 1A:
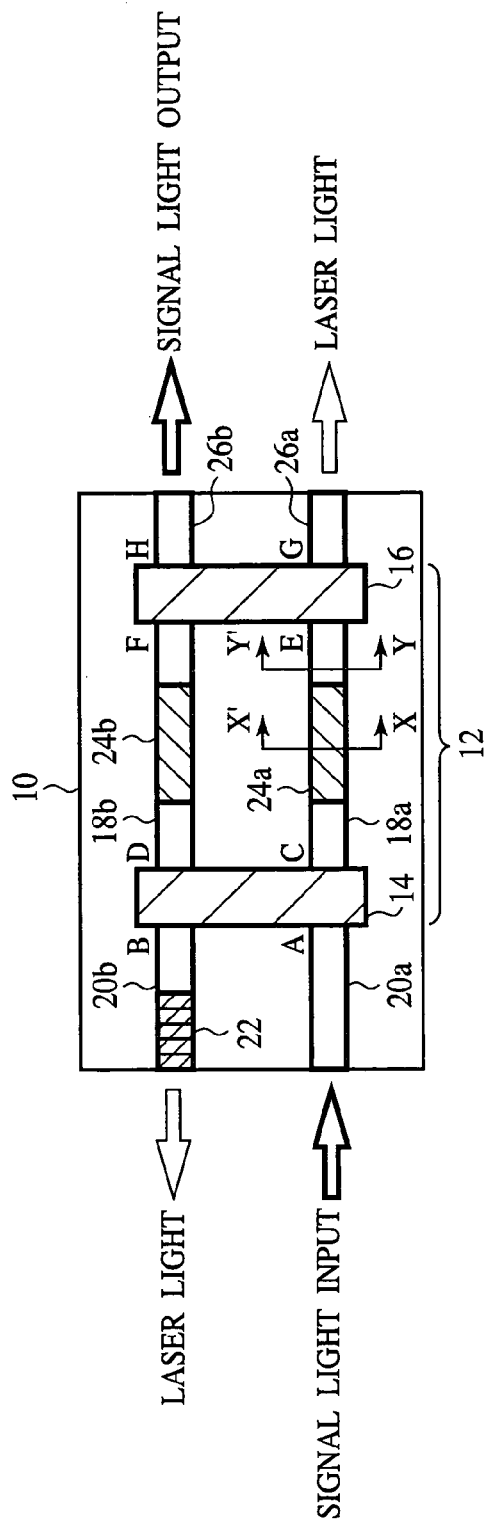
FIG. 1 is diagrammatic views of the optical amplifying device according to a first embodiment of the present invention, which show a structure thereof.
Figure 1C:
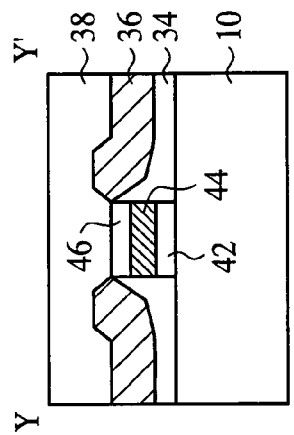
Figure 1B:
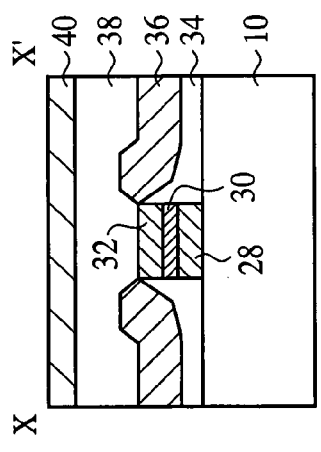

First, the optical amplifying device according to the present embodiment will be explained with reference to FIG. 1. FIG. 1A is the upper side view of the optical amplifying device according to the present embodiment. FIG. 1B is the sectional view along the line X–X' in FIG. 1A. FIG. 1C is the sectional view along the line Y–Y' in FIG. 1A.

The optical amplifying device according to the present embodiment basically comprises a symmetrical Mach-Zehnder interferometer 12 formed on an n type InP substrate 10. That is, as shown in FIG. 1A, on the n type InP substrate 10 there are formed a 3 dB optical coupler 14 having input ports A, B and output ports C, D, a 3 dB optical coupler 16 having input ports E, F and output ports G, H, and optical waveguides 18a, 18b of one optical path length interconnecting the output ports C, D of the 3 dB optical coupler 14 and the input port E, F of the 3 dB optical coupler 16, respectively. The optical waveguide 18a and the optical waveguide 18b are formed substantially in parallel with each other. Thus, the Mach-Zehnder interferometer 12, which realizes the filter function of separating signal light from control light, is formed on the n type InP substrate 10.

One end of the optical waveguide 20a, which is formed on the n type InP substrate 10 and into which signal light to be amplified is inputted, is connected to the input port A of the 3 dB optical coupler 14. The other end of the optical waveguide 20a, to which signal light is inputted, is positioned in the end surface of the n type InP substrate 10 on the input side of signal light.

A DFB (Distributed FeedBack) laser 22, which is formed on the n type InP substrate 10 and functions as a light source for control light for controlling amplification factors of signal light by an SOA is connected to the input port B of the 3 dB optical coupler 14 via the optical waveguide 20b formed on the n type InP substrate 10.

SOAs 24a, 24b which amplify light propagating through the respective optical waveguides 18a, 18b are provided in the optical waveguides 18a, 18b, respectively. The SOAs 24a, 24b can be, e.g., polarization-independent semiconductor optical amplifiers. The polarization-independent semiconductor optical amplifier is detailed in, e.g., Japanese Patent Application Unexamined Publication No. 2001-53392 by the inventor of the present application.

One ends of the optical waveguide 26a, 26b formed on the n type InP substrate 10 are connected to the output ports G, H of the 3 dB optical coupler 16 respectively. The other ends of the optical waveguides 26a, 26b are positioned in the end surface of the n type InP substrate 10 on the output side of signal light.

The sectional configuration of the region where the SOA 24a or the SOA 24b is formed is as shown in FIG. 1B. That is, on the n type InP substrate 10 there are sequentially laid a 100 nm-thickness non-strained InGaAsP light confining layer 28 of a 1.2 μm-composition, a 50 nm-thickness InGaAs active layer 30 of a 0.25% elongation strain and a 100 nm-thickness non-strained InGaAsP light confining layer 32 of a 1.2 μm-composition. The InGaAsP light confining layer 28, the InGaAs active layer 30 and the InGaAsP light confining layer 32 are patterned in a mesa forming the optical waveguide. On the n type InP substrate 10 on both sides of the mesa there are sequentially formed a p type InP current blocking layer 34 and an n type InP current blocking layer 36. A p type InP clad layer 38 is formed on the entire surface of the n type InP substrate 10 with these layers formed on. An InGaAs contact layer 40 is formed on the p type InP clad layer 38.

The sectional configuration of the region where the SOA 24a or the SOA 24b is not formed is as shown in FIG. 1C. That is, on the n type InP substrate 10, there are sequentially laid a 50 nm-thickness lower clad layer 42 of undoped InP, a 100 nm-thickness core layer 44 of non-strained and 1.3 μm-composition InGaAsP, and a 50 nm-thickness upper clad layer 46 of undoped InP. The lower clad layer 42, the core layer 44 and the upper clad layer 46 are patterned in a mesa forming the optical waveguide. On the InP substrate 10 on both sides of the mesa there are sequentially formed the p type InP current blocking layer 34 and the n type InP current blocking layer 36. The p type InP clad layer 38 is formed on the entire surface of the n type InP substrate 10 with these layers formed on.

As described above, the optical amplifying device according to the present embodiment is characterized mainly in that the respective constituent elements of the optical amplifier having the function of controlling light output levels are integrated monolithically on one and the same substrate.

The conventional optical amplifying device having the function of controlling light output levels includes respective modules, such as the light source for control light, the optical couplers, the SOAs, the filters, etc., which are constituent members, interconnected by optical fibers. This makes it difficult to miniaturize the optical amplifying device and requires much work in the mounting process.

Figure 13:
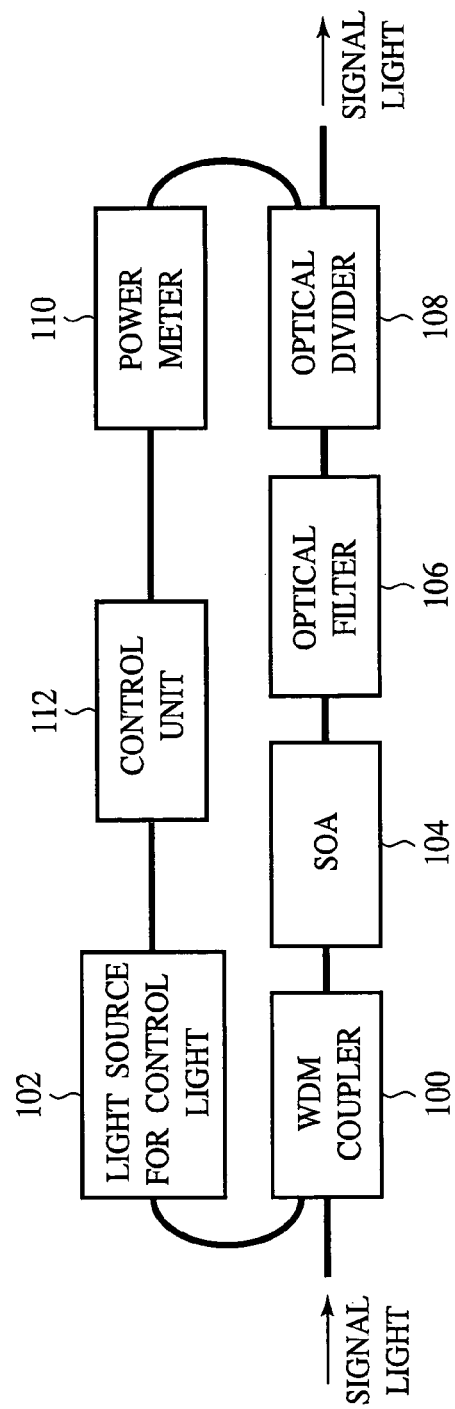
FIG. 13 is a block diagram of the conventional optical amplifying device having a function of controlling output levels, which shows the structure thereof.

In contrast to such a conventional device, the optical amplifying device according to the present embodiment includes the respective constituent elements formed on one and the same substrate, which permits the optical amplifying device to be smaller-sized. A device length can be, e.g., about 3 mm. The respective constituent elements are formed on one and the same substrate, which allows a number of the necessary optical parts to be drastically decreased. For example, the conventional optical amplifying device shown in FIG. 13 requires totally 10 lenses, 3 isolators and 2 Peltier devices. In contrast to this, the optical amplifying device according to the present embodiment requires totally 4 lenses, 2 isolators and 1 Peltier device, and the number of the necessary optical parts is drastically decreased in comparison with the number of the optical parts required in the conventional optical amplifying device. Furthermore, the optical amplifying device according to the present embodiment does not require the step of mounting the modules by using optical fibers which takes much work, as does the conventional optical amplifying device, and allows the respective optical parts to be mounted by steps equivalent to those of mounting the usual SOAs. Accordingly, the cost of the optical amplifying device according to the present embodiment can be low.

(Operation of the Optical Amplifying Device)

Next, the operation of the optical amplifying device according to the present embodiment will be explained with reference to FIG. 1.

Signal light to be amplified is inputted to one end of the optical waveguide 20a. The signal light inputted into the optical waveguide 20a is inputted to the input port A of the 3 dB optical coupler 14.

The DFB laser 22 disposed on one end of the optical waveguide 20b outputs a laser light of a preset power as control light and controls a power of the laser light, based on an output of the signal light. The control light outputted by the DFB laser 22 is inputted to the input port B of the 3 dB optical coupler 14. Current to be injected into the DFB laser 22 is controlled to control a light level of the laser light, whereby an amplification factor of the signal light can be controlled by the SOAs 24a, 24b. A feedback mechanism for controlling current to be injected into the DFB laser 22, based on outputs of signal light can be formed to thereby make output levels of the amplified signal light constant.

The signal light inputted to the input port A is divided equally by the 3 dB optical coupler 14. The evenly divided signal light is outputted respectively from the output ports C, D of the 3 dB optical coupler 14.

On the other hand, the control light inputted to the input port B is evenly divided by the 3 dB optical coupler 14. The evenly divided control light is outputted respectively from the output ports C, D of the 3 dB optical coupler 14.

Thus, the signal light and the control light are evenly divided and coupled by the 3 dB optical coupler 14 to be inputted respectively to the optical waveguides 18a, 18b.

The signal light and control light inputted respectively to the optical waveguides 18a, 18b are amplified by the SOAs 24a, 24b and then are inputted respectively to the input ports E, F of the 3 dB optical coupler 16.

Here, in a case that the SOAs 24a, 24b are polarization independent, even when a polarization state of signal light transiently changes, an amplification factor can be always constant.

The signal light inputted to the input ports E, F of the 3 dB optical coupler 16 are coupled by the 3 dB optical coupler 16. At this time, because the paths the signal light has passed through are symmetrical, the coupled signal light is outputted from the output port H, which is a cross port with respect to the input port A of the 3 dB optical coupler 14 to which the signal light has been inputted.

On the other hand, the control light inputted to the input ports E, F of the 3 dB optical coupler 16 are coupled by the 3 dB optical coupler 16. The paths the control light has passed through are also symmetrical, and the coupled control light is outputted from the output port G, which is the cross port with respect to the input port B of the 3 dB optical coupler 14.

Thus, the Mach-Zehnder interferometer 12 comprising the 3 dB optical coupler 14, the optical waveguides 18a, 18b, whose optical paths are equal to each other, and the 3 dB optical coupler 16 realizes the optical filter function which separates the signal light amplified by the SOAs 24a, 24b from the control light.

The signal light outputted from the output port H is outputted from the other end of the optical waveguide 26b. On the other hand, the control light outputted from the output port G is outputted from the other end of the optical waveguide 26a.

Thus, the signal light inputted into the optical waveguide 20a is amplified, and the amplified signal light is spatially separated and outputted from the other end of the optical waveguide 26b.

(Method for Fabricating the Optical Amplifying Device)

Next, the method for fabricating the optical amplifying device according to the present embodiment will be explained with reference to FIGS. 2 to 5. The figures on the left side of FIGS. 2A to 2C, 3A to 3C, 4A to 4C, 5A, and 5B show sectional views of the regions where the DFB laser and the SOAs are to be formed, in the steps of the method for fabricating the optical amplifying device. The figures on the right side of FIGS. 2A to 2C, 3A to 3C, 4A to 4C, 5A, and 5B show the sectional views of the regions where the optical waveguides are to be formed, in the steps of the method for fabricating the optical amplifying device.

First, a diffraction grating is formed in a region on an n type InP substrate 10, where the DFB laser 22 is to be formed. For example, a diffraction grating pattern is formed by two-beam interference exposure on a resist film formed by applying a positive resist to the n type InP substrate 10. Then, by direct contact exposure using a mask which does not apply exposure light to the resist film on the region for the DFB laser 22 to be formed in, and development following the exposure, the diffraction grating pattern is formed only in the resist film on the region for the DFB laser 22 to be formed in. Then, the diffraction grating is formed in the region of the n type InP substrate 10, where the DFB laser 22 is to be formed, by RIE using as an etching gas a mixed gas of $C_2H_6$, $H_2$ and $O_2$ and by using as a mask the resist film with the diffraction grating pattern formed in.

Figure 2A:
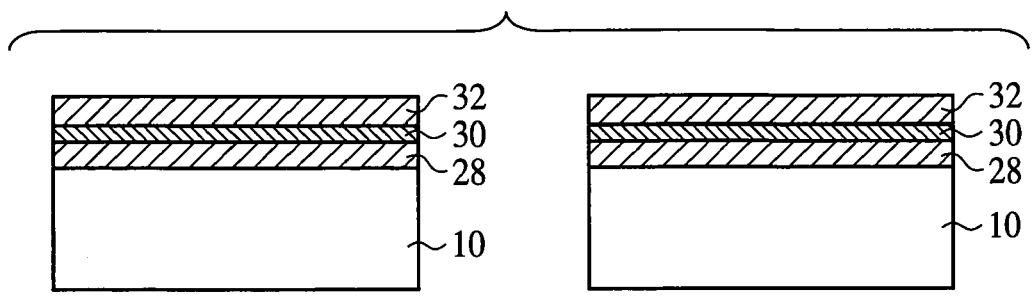
FIG. 2 is sectional views of the optical amplifying device according to the first embodiment of the present invention in the steps of the method for fabricating the same, which show the method (Part 1).

Then, the InGaAs light confining layer 28 of a 100 nm-thickness non-strained 1.2 μm-composition, the InGaAs active layer 30 of a 50 nm-thickness and a 0.25% tensile strain, and the InGaAs light confining layer 32 of a 100 nm-thickness non-strained 1.2 μm-composition are sequentially formed on the entire surface of the n type InP substrate 10 by, e.g., metal organic chemical vapor deposition (MOCVD) (FIG. 2A).

Figure 2B:
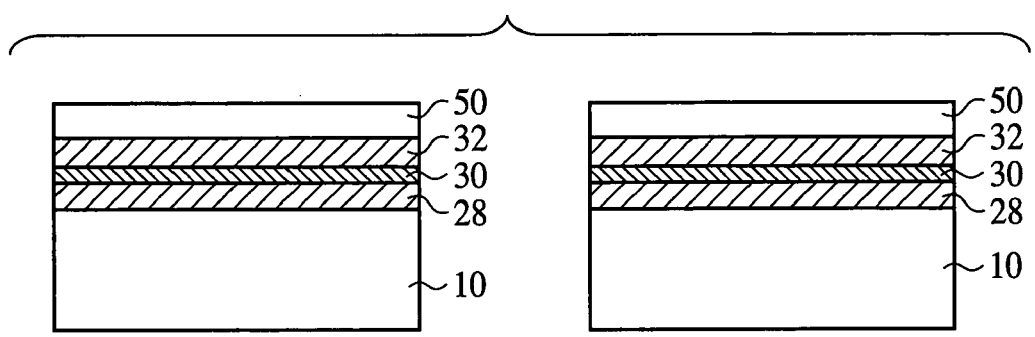

Next, a silicon oxide film 50 is formed on the InGaAsP light confining layer 32 (FIG. 2B).

Figure 2C:
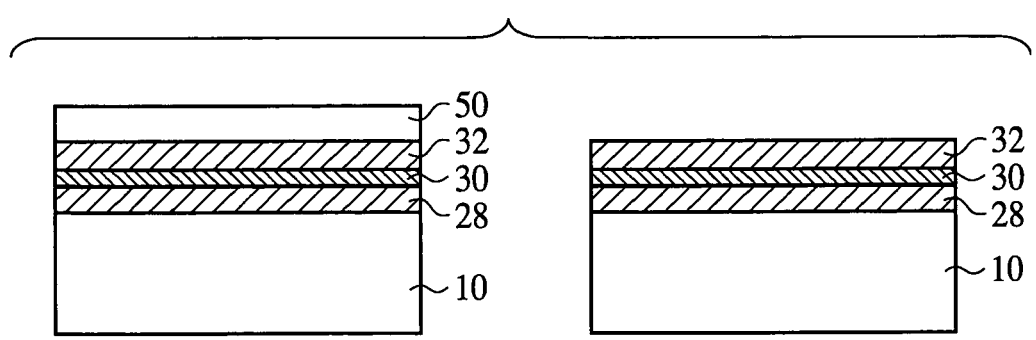

Then, by photolithography and etching, an opening for exposing the region where the DFB laser 22 and the SOAs 24a, 24b are not formed is opened in the silicon oxide film 50 (FIG. 2C).

Figure 3A:
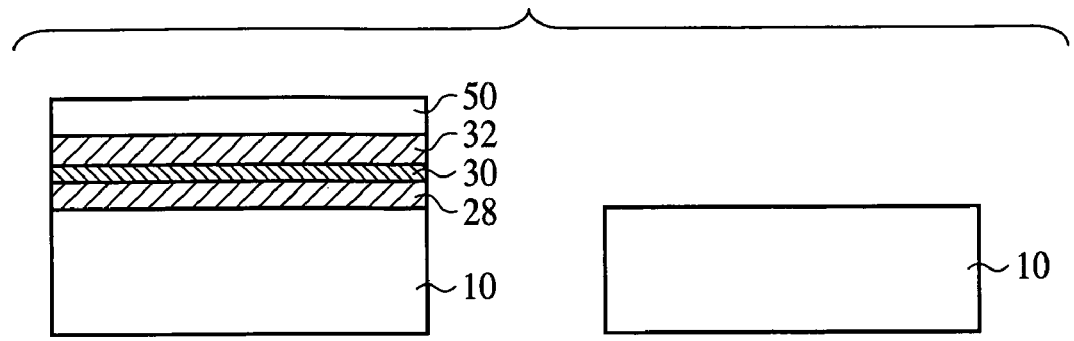
FIG. 3 is sectional views of the optical amplifying device according to the first embodiment of the present invention in the steps of the method for fabricating the same, which show the method (Part 2).

Then, by reactive ion etching (RIE) using as an etching gas e.g., a mixed gas of $C_2H_6$, $H_2$ and $O_2$ and with the silicon oxide film 50 as a mask, the InGaAsP light confining layer 32, the InGaAs active layer 30 and the InGaAsP light confining layer 28 on the region of the n type InP substrate 10 where the DFB laser 22 and the SOAs 24a, 24b are not formed are removed (FIG. 3A).

Thus, the active layer structures are formed only on the regions of the n type InP substrate where the DFB laser 22 and the SOAs 24a, 24b are to be formed.

Figure 3B:
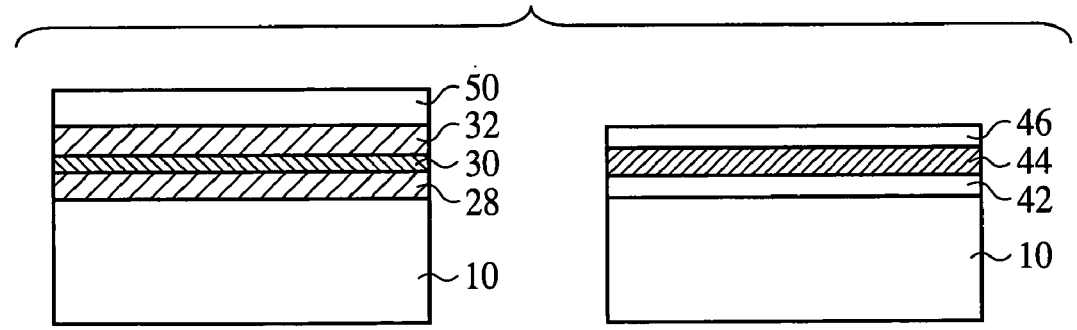
Figure 3C:
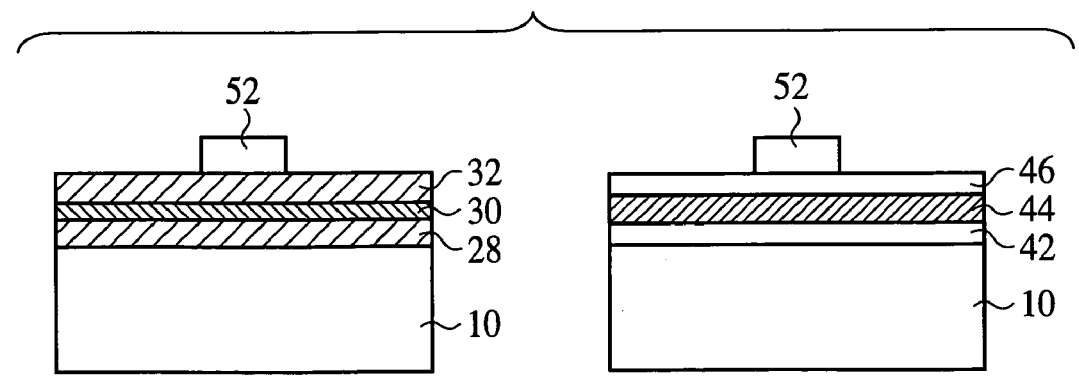

Then, the lower clad layer 42, the core layer 44 and the upper clad layer 46 are sequentially laid by, e.g., MOCVD on the n type InP substrate 10 in the region where the InGaAs active layer, etc. have been removed and where the DFB laser 22 and the SOAs 14a, 14b are not to be formed (FIG. 3B). Next, the silicon oxide film 50 is removed by wet etching using, e.g., hydrofluoric acid.

Thus, the passive layer structure is formed on the region of the n type InP substrate 10, where the DFB laser 22 and the SOAs 24a, 24a are not formed.

Next, a silicon oxide film 52 is formed on the entire surface of the n type InP substrate 10 having the region where the active layer structure is thus formed, and the region where the passive layer structure is thus formed. Then, by lithography and etching, the silicon oxide film 52 is patterned into the optical waveguides 18a, 18b, 20a, 20b, 26a, 26b and the 3 dB optical couplers 14, 16.

Figure 4A:
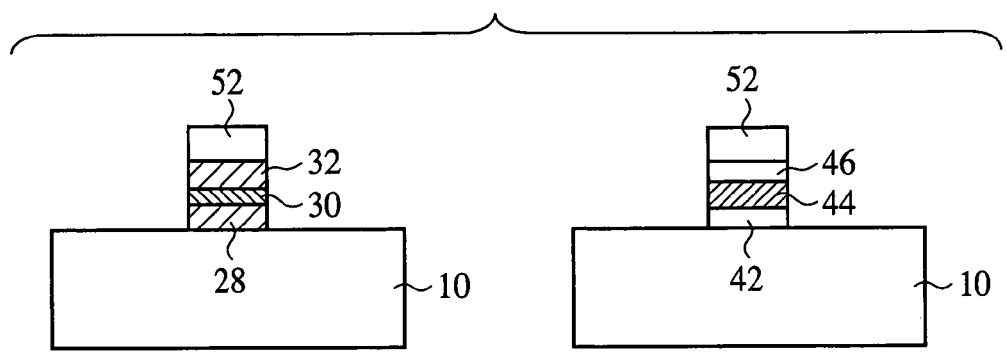
FIG. 4 is sectional views of the optical amplifying device according to the first embodiment of the present invention in the steps of the method for fabricating the same, which show the method (Part 3).

Next, the InGaAsP light confining layer 32, the InGaAs active layer 30 and the InGaAsP light confining layer 28, and the upper clad layer 46, the core layer 44 and the lower clad layer 42 are etched by RIE using, as an etching gas e.g., a mixed gas of $C_2H_6$, $H_2$ and $O_2$ and with the patterned silicon oxide film 52 as a mask (FIG. 4A).

Thus, the optical waveguides 18a, 18b, 20a, 20b, 26a, 26b and the 3 dB optical couplers 14, 16 are formed in the core layer 44, and the active layer structures of the DFB laser 22 and the SOAs 24a, 24b are formed in a mesa.

Figure 4B:
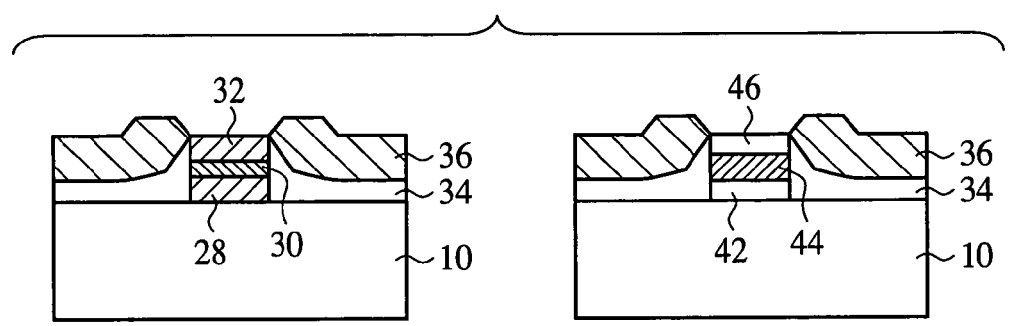

Next, with the silicon oxide film 52 continuously used as a selective growth mask, the p type InP current blocking layer 34 and the n type InP current blocking layer 36 are sequentially and selectively grown on the n type InP substrate 10 on both sides of the active layer structure of the patterned InGaAsP light confining layer 32, the InGaAs active layer 30 and the InGaAsP light confining layer 28 and the passive layer structure of the upper clad layer 46, the core layer 44 and the lower clad layer 42. The silicon oxide film 52 is removed by wet etching using, e.g., hydrofluoric acid after the p type InP current blocking layer 34 and the n type InP current blocking layer 36 have been formed (FIG. 4B).

Figure 4C:
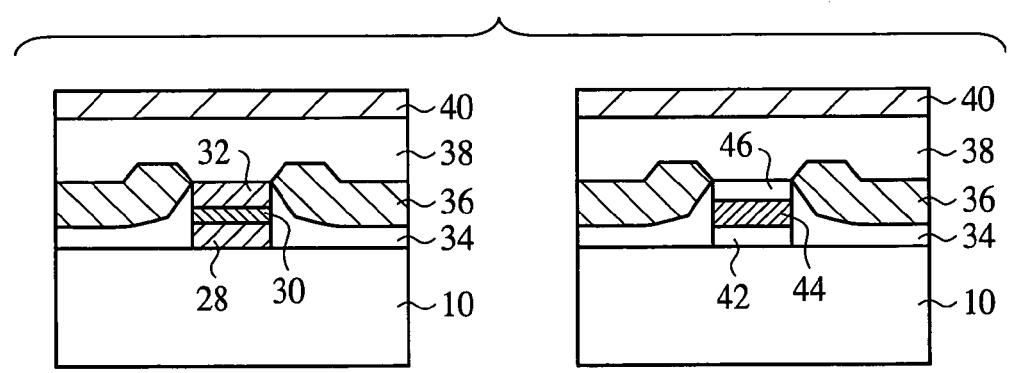

Then, the InP clad layer 38 and the InGaAs contact layer 40 are sequentially formed on the entire surface by, e.g., MOCVD (FIG. 4C).

Figure 5A:
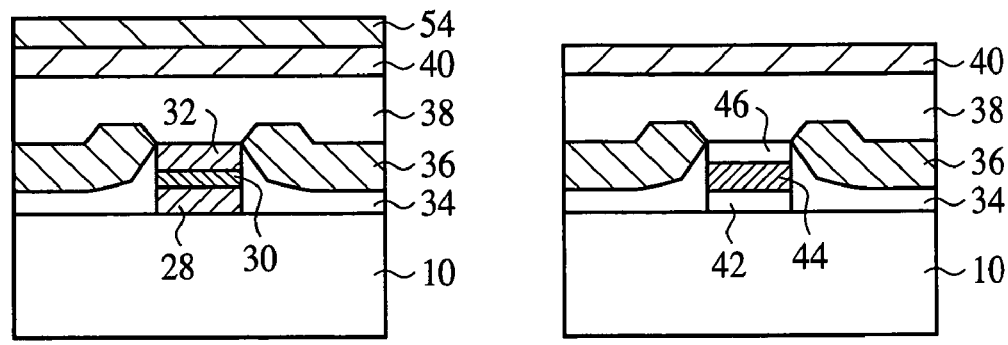
FIG. 5 is sectional views of the optical amplifying device according to the first embodiment of the present invention in the steps of the method for fabricating the same, which show the method (Part 4).

Next, a resist film 54 is formed on the InGaAsP contact layer 40. Then, the resist film 54 in the region except the region where the active layer structure has been formed is removed by, e.g., direct contact exposure and development following the exposure (FIG. 5A).

Figure 5B:
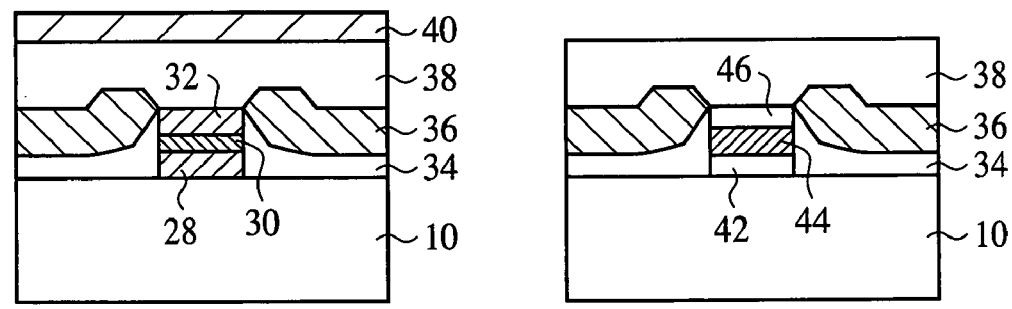

Then, only the contact layer 40 on the region where the active layer structure has been formed is left by wet etching using an etchant of, e.g., hydrofluoric acid and nitric acid and with the resist film 54 as a mask to remove the contact layer 40 on the region where the passive layer structure has been formed (FIG. 5B).

Then, electrodes (not shown) are formed respectively on the p side and n side of the regions where the DFB laser 22 and the SOAs 24a, 24b have been formed.

Next, the n type InP substrate 10 is cleaved along the cleavage face to thereby form the input side end surface and an output side end surface of signal light. Then, a non-reflective coat film (not shown) is formed on both formed end surfaces.

Thus, the optical amplifying device according to the present embodiment is fabricated.

As described above, according to the present embodiment, the respective constituent elements forming the optical amplifying device having the function of controlling light output levels are formed on one and the same substrate, whereby the optical amplifying device can be downsized in comparison with the conventional amplifying device. The respective constituent elements are formed on one and the same substrate, whereby a number of the optical parts can be smaller in comparison with that of the conventional optical amplifying device. The optical amplifying device according to the present embodiment can be fabricated by the steps equivalent to those of fabricating SOAs, which makes complicated mounting steps unnecessary, and accordingly the optical amplifying device having the function of controlling light output levels can be inexpensively provided.

(A Second Embodiment)

Figure 6:
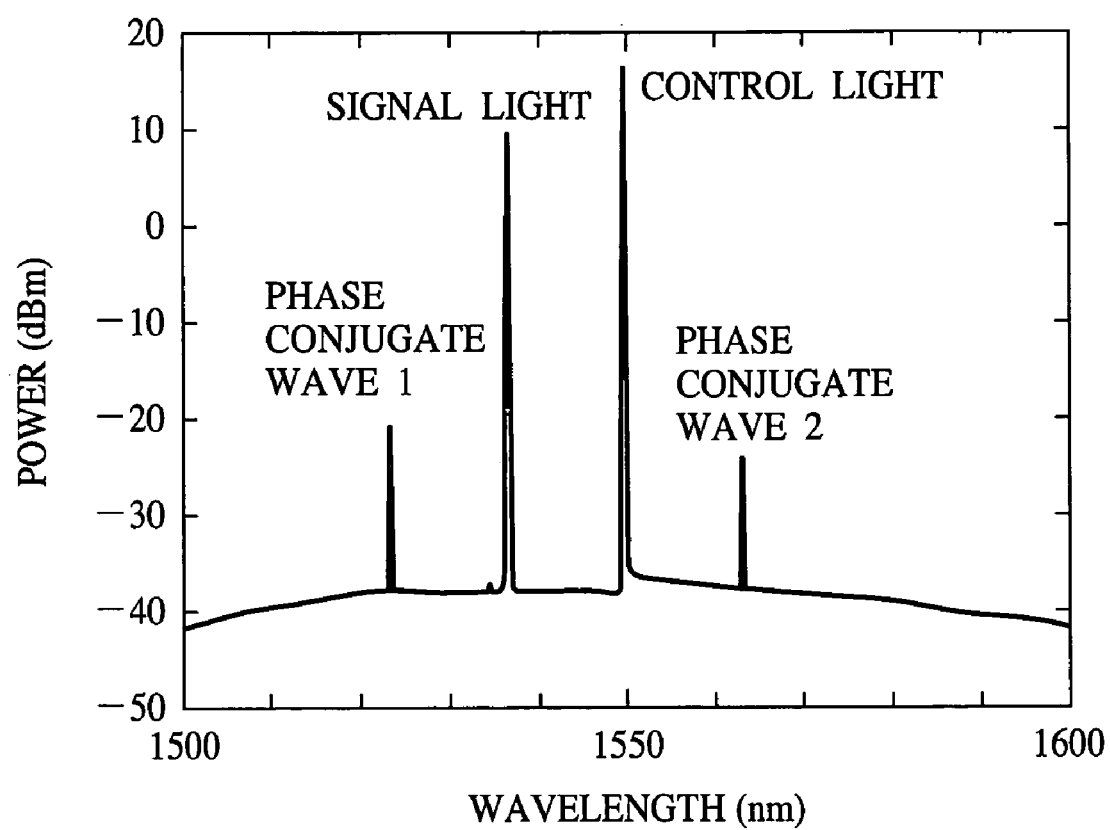
FIG. 6 is a graph of wavelength spectrum of phase conjugate waves due to four wave mixing when signal light and control light propagate in the SOA in the same direction.
Figure 7:
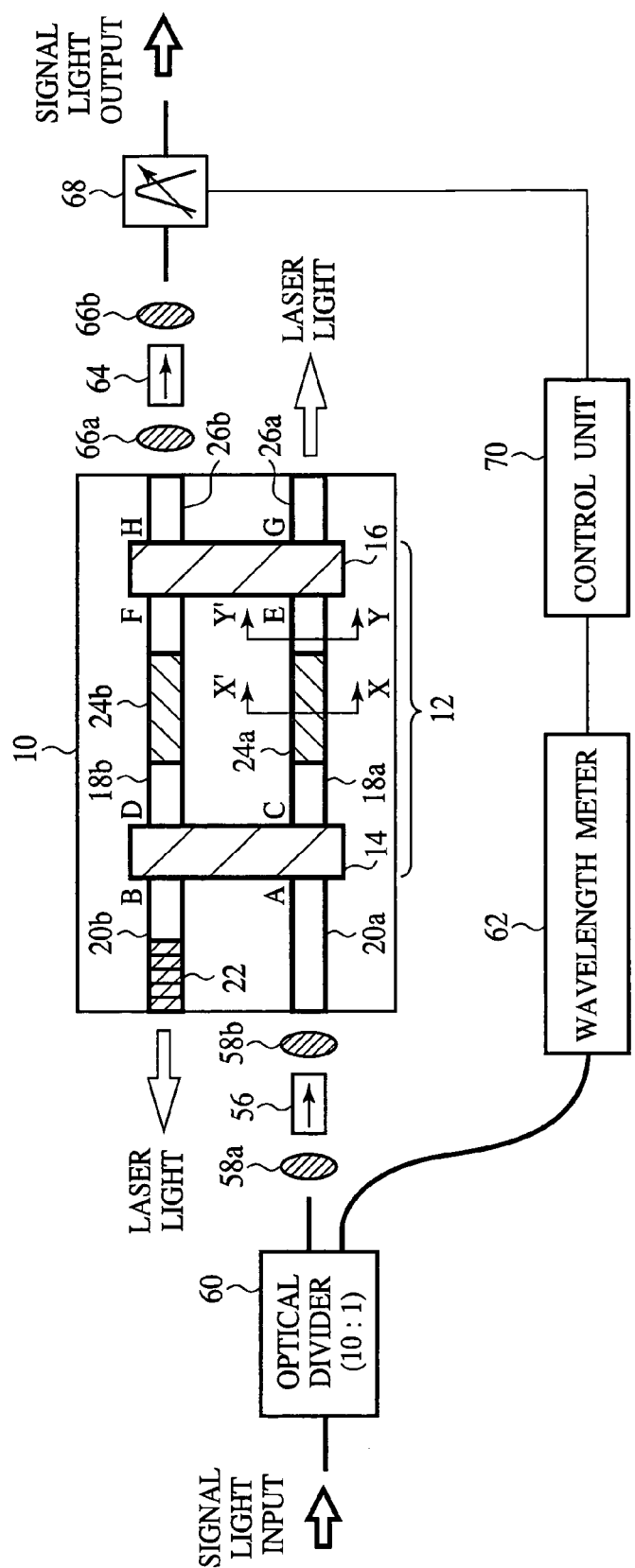
FIG. 7 is a plan view of the optical amplifying device according to a second embodiment of the present invention, which shows a structure thereof.

The optical amplifying device according to a second embodiment of the present invention will be explained with reference to FIG. 6. FIG. 6 is a graph of wavelength spectrum of the phase conjugate waves due to the optical four wave mixing taking place when signal light and control light propagate in the SOA in the same direction. FIG. 7 is a plan view of the optical amplifying device according to the present embodiment, which shows a structure thereof. The same members of the present embodiment as those of the optical amplifying device according to the first embodiment are represented by the same reference numbers not to repeat or to simplify their explanation.

In the optical amplifying device according to the first embodiment, the DFB laser 22 as the light source for control light is connected to the other input port B of the 3 dB optical coupler 14 for signal light to be inputted to. In this structure, the signal light and the control light propagate in the SOA 24a, 24b in the same direction.

When the signal light and the control light thus propagate in the SOAs 24a, 24b in the same direction, phase conjugate waves due to four wave mixing (FWM) are generated. That is, signal light of a wavelength $\lambda_s$ and control light of a wavelength $\lambda_c$ propagate in the SOAs 24a, 24b in the same direction, phase conjugate waves of a wavelength $2\lambda_s-\lambda_c$ and a wavelength $2\lambda_c-\lambda_s$.

FIG. 6 shows the wavelength spectrum of the output light of the SOA of, for example, signal light of a 1536 nm-wavelength and control light of a 1550 nm-wavelength which have propagated in the SOA. Based on the wavelength spectrum, besides the signal light of a 1536 nm-wavelength and the control light of a 1550 nm-wavelength, it can be seen that the phase conjugate waves of a 1522 nm-wavelength and a 1564 nm-wavelength are generated.

The phase conjugate waves generated due to the FWM in the SOA 24a, 24b are outputted respectively from two output ports G, H of the 3 dB optical coupler 16 and mixed in the amplified signal light to be noise components. Accordingly, in amplifying signal light by the optical amplifying device according to the first embodiment, it is often necessary to remove the phase conjugate waves which are to be the noise components. To this end, it is often necessary to dispose downstream of the output port H for the signal light a wavelength filter of a transmission bandwidth which does not transmit the phase conjugate waves but transmits the signal light.

By the way, in the optical communication systems, such as WDM system, etc., optical amplifying devices will be incorporated in the optical add and drop (OADM) and the optical cross connect (OXC), etc. In these cases, even if the optical amplifying devices are for one wave, it is probable that a wavelength $\lambda_s$ of signal light to be inputted to is not fixed and dynamically varies within a certain wavelength band. Such cases are exemplified by the case that a wavelength $\lambda_s$ of signal light arbitrarily varies in the C band (1530–1560 nm), which is the most common wavelength band used in the optical communication.

In these cases, for removing the phase conjugate waves, simply disposing the wavelength filter which transmits the C band downstream of the output port of the signal light will cause the following inconvenience. That is, signal light of some wavelengths has the phase conjugate waves due to the FWM, whose wavelengths are within the transmission band of the wavelength filter, and it is probable that the phase conjugate waves as the noise components cannot be sufficiently removed.

The optical amplifying device according to the present embodiment is characterized mainly in that the optical amplifying device according to the first embodiment includes a wavelength tunable filter whose transmission band can be varied being disposed downstream of the output port of the signal light, and a control mechanism for controlling a center wavelength of a transmission band of the wavelength tunable filter based on the wavelength of the signal light.

That is, as shown in FIG. 7, optical divider 60 for asymmetrical two-divisions is disposed upstream of the optical waveguide 20a with an isolator 56, and lenses 58a, 58b disposed on both sides of the isolator 56. The dividing ratio of the optical divider 60 is, e.g., 10:1. Signal light is inputted to the input port of the optical divider 60. That of the output ports of the optical divider 60, which has the larger dividing ratio, is optically connected to the optical waveguide 20a via the isolator 56, and the lenses 58a, 58b disposed on both sides of the isolator 56, so that signal light outputted from the output port can be inputted into the optical waveguide 20a. That of the output ports of the optical divider 60, which has the smaller dividing ratio, is connected to a wavelength meter 62 which detects signal light outputted from the output port to measure its wavelength.

On the other hand, a wavelength tunable filter 68 is disposed downstream of an optical waveguide 26b from which signal light is outputted via an isolator 64, and lenses 66a, 66b disposed on both sides of the isolator 64. The wavelength tunable filter 68 is connected to a control unit 70 for controlling a transmission band of the wavelength tunable filter 68, based a measured result of a wavelength of signal light given by the wavelength meter 62.

The optical amplifying device according to the present embodiment amplifies signal light basically in the same way as the optical amplifying device according to the first embodiment does. During the signal light amplification, the control unit 70 set a transmission band center wavelength of the wavelength tunable filter 68, based on a measured result of the wavelength of signal light given by the wavelength meter 62 so that the transmission band of the wavelength tunable filter 68 does not transmit the phase conjugate waves but transmits the signal light. Thus, even when the wavelength of signal light to be amplified dynamically varies, the phase conjugate waves mixed in the signal light which has been amplified and outputted from one end of the optical waveguide 20b can be removed without failure.

As described above, according to the present embodiment, a transmission band of the wavelength tunable filter 68 is controlled, based on a measured result of a wavelength of signal light given by the wavelength meter 62, whereby even when a wavelength of signal light to be amplified dynamically varies, the phase conjugate waves mixed in the signal light, which are to be noise components can be removed without failure.

(A Third Embodiment)

Figure 8:
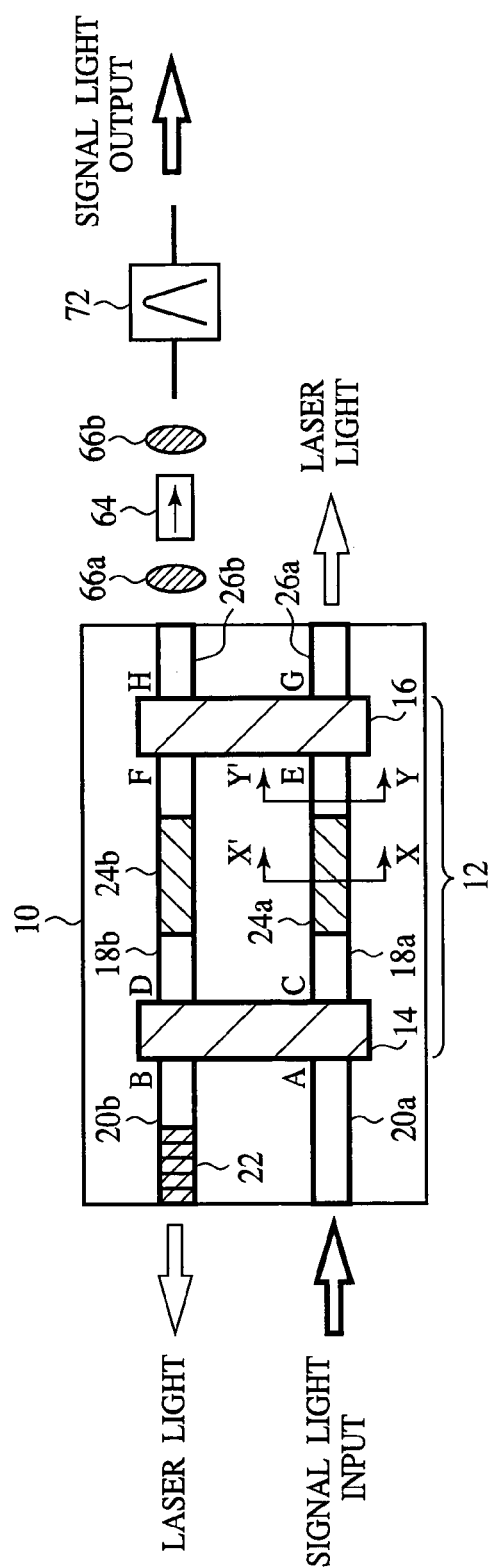
FIG. 8 is a plan view of the optical amplifying device according to a third embodiment of the present invention, which shows a structure thereof.

The optical amplifying device according to a third embodiment of the present invention will be explained with reference to FIG. 8. FIG. 8 is a plan view of the optical semiconductor device according to the present embodiment, which shows a structure thereof. The same members of the present embodiment as those of the optical amplifying device according to the first and the second embodiments are represented by the same reference numbers not to repeat or to simplify their explanation.

The basic structure of the optical amplifying device according to the present embodiment is the same as that of the optical amplifying device according to the first embodiment. The optical amplifying device according to the present embodiment is characterized mainly in that the optical amplifying device includes a wide band transmission wavelength filter 72 having a transmission band containing a plurality of signal light wavelengths so as to remove the phase conjugate waves which are generated due to FWM in the SOA and mixed in amplified signal light.

That is, as shown in FIG. 8, a wide band transmission wavelength filter 72 is disposed downstream of an optical waveguide 26b from which signal light is to be outputted via an isolator 64, and lenses 66a, 66b disposed on both sides of the isolator 64.

The wide band transmission wavelength filter 72 has a wide transmission band width containing wavelengths of a plurality of signal light, which corresponds to wavelength band of signal light to be amplified, and the wide transmission band width is set not to contain wavelengths of the phase conjugate waves. This makes it unnecessary that the transmission center wavelength of the wide band transmission wavelength filter 72 must be tunable and makes a wavelength meter 62 and a control unit 70 unnecessary. The optical amplifying device according to the present embodiment can remove the phase conjugate waves generated due to the FWM in the SOAs 24a, 24b in a smaller size and lower cost in comparison with the optical amplifying device according to the second embodiment.

(A Fourth Embodiment)

Figure 9:
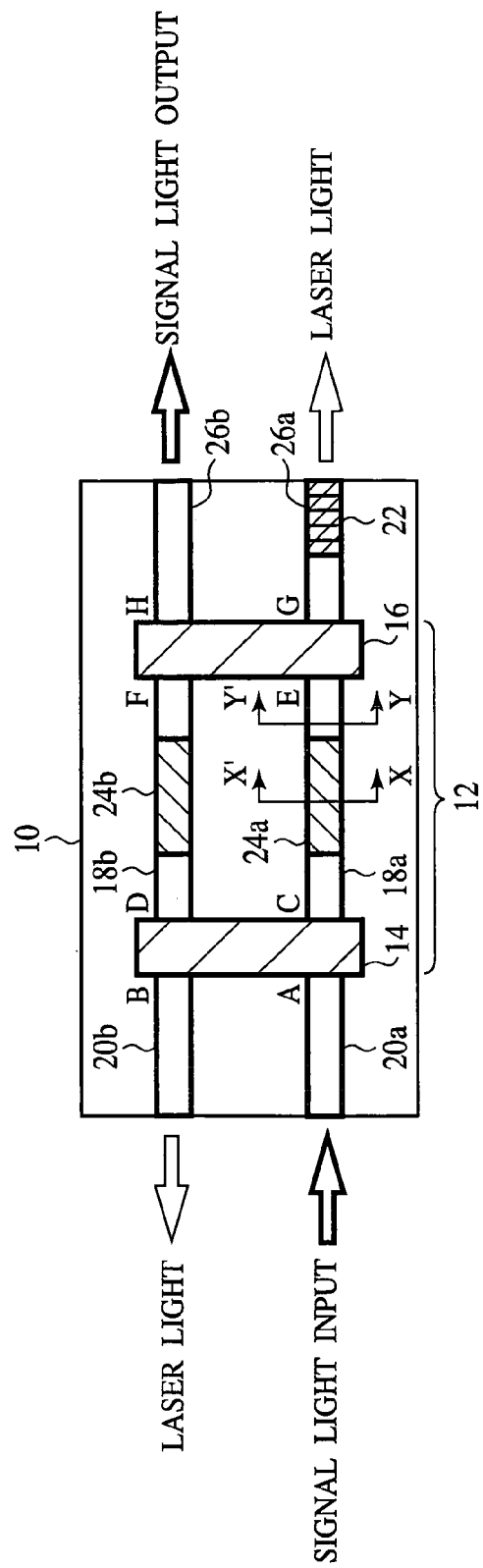
FIG. 9 is a plan view of the optical amplifying device according to a fourth embodiment of the present invention, which shows a structure thereof.
Figure 10:
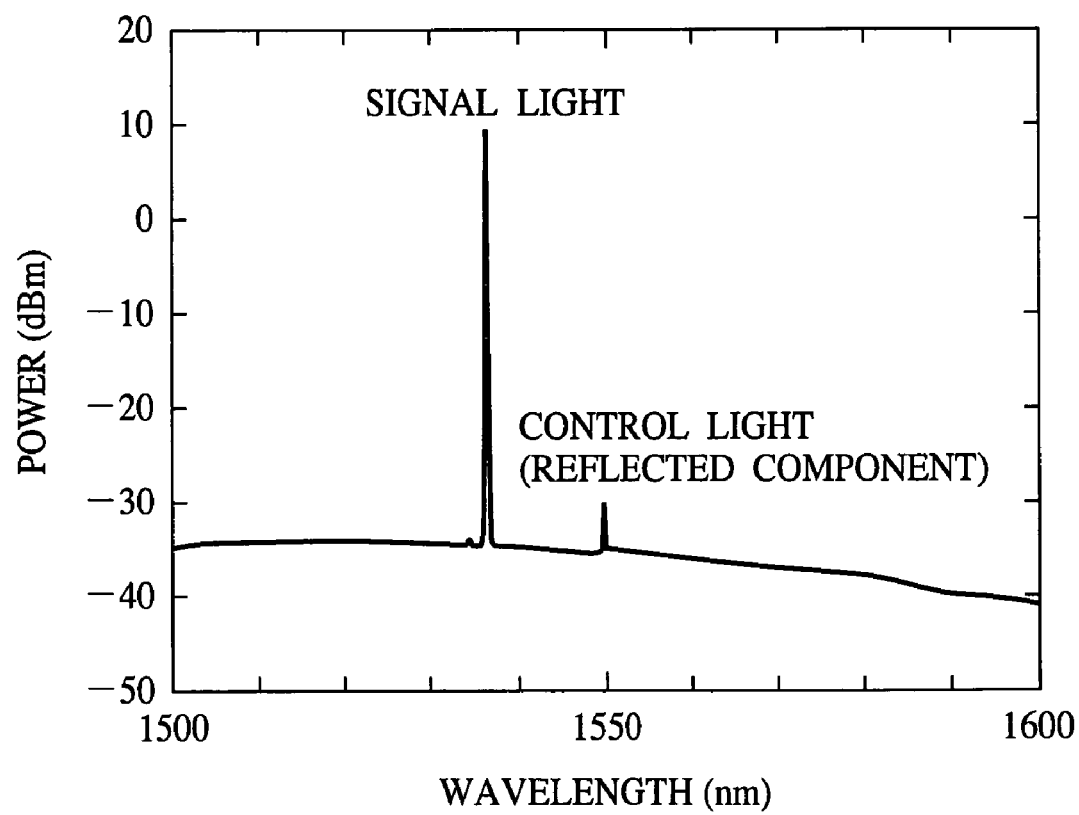
FIG. 10 is a graph of wavelength spectrum of signal light and control light propagating in the SOA in the direction opposite to each other.
Figure 11:
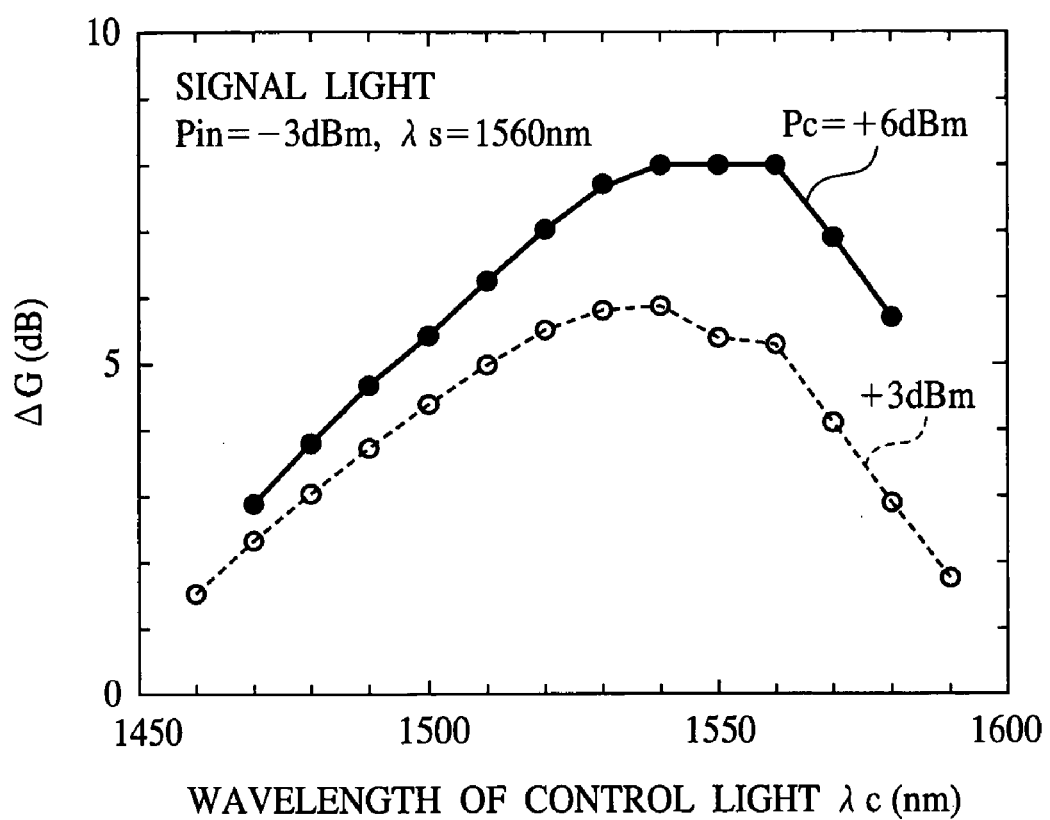
FIG. 11 is a graph of the dependency of gain changes due to light injection on the wavelength of control light.
Figure 12:
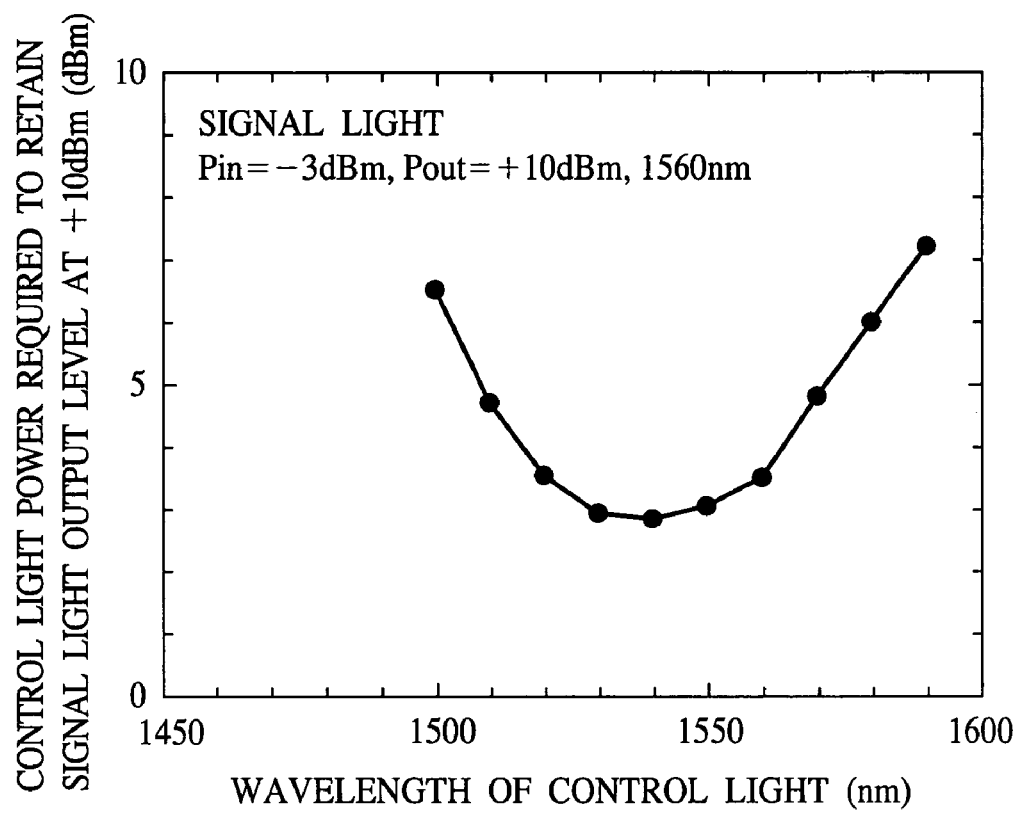
FIG. 12 is a graph of the dependency of the power of control light required to retain the output level of signal light constant on the wavelength of control light.

The optical amplifying device according to a fourth embodiment of the present invention will be explained with reference to FIG. 9. FIG. 9 is a plan view of the optical amplifying device according to the present embodiment, which shows a structure thereof. FIG. 10 is a graph of wavelength spectrum of signal light and control light which propagate in the SOA in the directions opposite to each other. FIG. 11 is a graph of the dependency of gain changes due to light injection on the wavelength of control light. FIG. 12 is a graph of the dependency of the power of control light required to retain output levels of signal light constant on the wavelength of control light. The same members of the present embodiment as those of the optical amplifying device according to the first embodiment are represented by the same reference numbers not to repeat or to simplify their explanation.

The optical amplifying device according to the second and the third embodiment can remove respectively by the wave tunable filter 68, etc. and by the wide band transmission wavelength filter 72 the phase conjugate waves generated due to the FWM in the SOAs 24a, 24b. However, the optical amplifying device according to the second and the third embodiments have the following disadvantage.

The optical amplifying device according to the second embodiment includes the wavelength tunable filter 68, the wavelength meter 62 used in controlling a transmission band, and the control unit 70. Such large part numbers make the device size large and make the cost high.

On the other hand, the optical amplifying device according to the third embodiment includes the wide band transmission wavelength filter 72 for removing the phase conjugate waves. In comparison with the optical amplifying device according to the second embodiment, the optical amplifying device according to the third embodiment can realize the removal of the phase conjugate waves with a smaller size and at lower costs. However, the optical amplifying device according to the second embodiment cannot remove the phase conjugate waves unless wavelengths of the phase conjugate waves are outside a wide transmission band of the wide band transmission wavelength filter 72. Accordingly, the removal of the phase conjugate waves is restricted by the wavelength $\lambda_c$ of the control light.

For example, when the wavelength $\lambda_s$ of signal light is in the entire C band, the transmission band width of the wide band transmission wavelength filter 72 is set to contain at least 1530–1560 nm. In this case, even when the wavelength $\lambda_s$ of the signal light is any within the range of 1530–1560 nm, the phase conjugate waves of a $2\lambda_s-\lambda_c$ wavelength and a $2\lambda_c-\lambda_s$ wavelength must be shorter than 1530 nm or longer than 1560 nm, which are outside the transmission band of the wide transmission wavelength filter 72. Accordingly, the wavelength $\lambda_c$ of the control light must be below 1500 nm including 1500 nm or above 1590 nm including 1590 nm.

In contrast to the optical amplifying device according to the second and the third embodiment, the optical amplifying device according to the present embodiment can prevent the generation of the phase conjugate waves due to the FWM in the SOAs 24a, 24b without being restricted by the wavelength of the control light.

First, the structure of the optical amplifying device according to the present embodiment will be explained with reference to FIG. 9.

The optical amplifying device according to the present embodiment is basically constituted by a symmetric Mach-Zehnder interferometer 12 formed on an n type InP substrate 10, as in the optical amplifying device according to the first embodiment.

The respective ports of 3 dB optical couplers 14, 16 constituting the symmetric Mach-Zehnder interferometer 12 are called input ports A, B, E, F, and output ports C, D, G, H, as are in the optical amplifying device according to the first embodiment, and as will be described later, the input ports B, E, F are output ports for control light, and the output ports C, D, G are input ports for control light.

As in the optical amplifying device according to the first embodiment, the input port A of the 3 dB optical coupler 14 is connected to one end of an optical waveguide 20a into which signal light to be amplified is inputted formed on the n type InP substrate 10. The other end of the optical waveguide 20a for signal light to be inputted into is positioned on the end surface of the input side of the n type InP substrate 10, where signal light is inputted.

The input port B of the 3 dB optical coupler 14 is connected to one end of the optical waveguide 20b formed on the n type InP substrate 10. The other end of the optical waveguide 20b is positioned on the end surface of the n type InP substrate 10, and the DFB laser 22 is not connected to the optical waveguide 20b, as is in the optical amplifying device according to the first embodiment.

As in the optical amplifying device according to the first embodiment, the output port D of the 3 dB optical coupler 14 and the input port F of the 3 dB optical coupler 16 are interconnected with each other by an optical waveguide 18a with the SOA 24a provided in. As in the optical amplifying device according to the first embodiment, the output port C of the 3 dB optical coupler 14 and the input port E of the 3 dB optical coupler 16 are interconnected with each other by an optical waveguide 18b with an SOA 24b provided in.

As in the optical amplifying device according to the first embodiment, the output port H of the 3 dB optical coupler 16 is connected to one end of an optical waveguide 26b formed on the n type InP substrate 10.

The output port G of the 3 dB optical coupler 16 is connected to one end of the optical waveguide 26a formed on the n type InP substrate 10. A DFB laser 22 as the light source for control light is connected to the other end of the optical waveguide 26a, as is not in the optical amplifying device according to the first embodiment.

The optical amplifying device constituted as described above can be fabricated substantially in the same way as the optical amplifying device according to the first embodiment except for the position for the DFB laser 22 is formed in.

As described above, the optical amplifying device according to the present embodiment is characterized mainly in that the DFB laser 22 as the light source for control light is connected to the output port G of the 3 dB optical coupler 16 including the output port H for amplified signal light to be outputted from, which (the output port G) is on the same side as the output port H for signal light. The operation of the optical amplifying device according to the present embodiment, and characteristics thereof will be detailed below.

As in the optical amplifying device according to the first embodiment, signal light to be amplified is inputted into the optical waveguide 20a at one end thereof. The signal light inputted into the optical waveguide 20a is inputted into the input port A of the 3 dB optical coupler 14.

Laser light of a certain power as control light has been outputted in advance from the DFB laser 22 disposed on one end of the optical waveguide 26a and has the power controlled, based on an output of the signal light. The control light outputted from the DFB laser 22 propagates through the optical waveguide 26a to be inputted into the output port G of the 3 dB optical coupler 16. As in the optical amplifying device according to the first embodiment, current to be injected into the DFB laser 22 is controlled to thereby control a light level of the laser light to be outputted, whereby amplification factors of amplifying the signal light by the SOAs 24a, 24b can be controlled. It is also possible that a feedback mechanism for controlling current to be injected into the DFB laser 22, based on an output of signal light so as to make the output level of the amplified signal light constant.

The signal light to be inputted into the input port A is evenly divided by the 3 dB optical coupler 14. The evenly divided signal light is outputted respectively from the output ports C, D of the 3 dB optical coupler 14. Thus, the signal light is evenly divided and coupled by the 3 dB optical coupler 14, then outputted from the output ports C, D and inputted respectively into the optical waveguides 18a, 18b.

On the other hand, the control light inputted into the output port G is evenly divided by the 3 dB optical coupler 16. The evenly divided control light is outputted respectively from the input ports E, F. Thus, the control light is evenly divided and coupled by the 3 dB optical coupler 16, then outputted from the input ports E, F and inputted respectively into the optical waveguides 18a, 18b so as to propagate in the direction opposite to the signal light.

The signal light and the control light which have been inputted into the optical waveguides 18a, 18b so as to propagate in the opposite directions are amplified by the 24a, 24b. Then, the amplified signal light is inputted respectively into the input ports E, F of the 3 dB optical coupler 16. On the other hand, the amplified control light is inputted respectively into the output ports C, D of the 3 dB optical coupler 14. In the optical amplifying device according to the present embodiment, signal light and control light are inputted into the SOA 24a, 24b in the directions opposite to each other, are coupled and amplified in the SOAs 24a, 24b, and propagate in the opposite directions to be separated from each other.

As described above, in the optical amplifying device according to the present embodiment, signal light and control light propagate in the directions opposite to each other in the SOAs 24a, 24b.

FIG. 10 is a graph of wavelength spectrum of the output light of the signal light on the output side, which propagates in the SOA in the direction opposite to the control light. In this case, the wavelength of the signal light is 1536 nm, and the wavelength of the control light is 1560 nm. In this wavelength spectrum, the signal light is observed together with the reflected component of the control light, but no phase conjugate waves are observed. That is, it is found that signal light and control light are caused to propagate in the directions opposite to each other, whereby the generation of the phase conjugate waves due to the FWM in the SOA can be prevented.

The signal light inputted into the input ports E, F of the 3 dB optical coupler 16 are coupled by the 3 dB optical coupler 16. At this time, the signal light, which has propagated along the paths symmetric to each other, is coupled and outputted from the output port H, which is the cross port with respect to the input port A of the 3 dB optical coupler 14 into which the signal light has been inputted. The signal light and the control light propagate in the SOAs 24a, 24b in the directions opposite to each other here, whereby no phase conjugate waves due to the FWM in the SOA 24a, 24b take place, and accordingly, no phase conjugate waves are mixed.

On the other hand, the control light inputted into the output ports C, D is also coupled by the 3 dB optical coupler 14. The control light, which has propagated along the paths symmetric to each other, is outputted from the input port B, which is the cross port with respect to the output port G of the 3 dB optical coupler 16.

As described above, the symmetric Mach-Zehnder interferometer 12 including the 3 dB optical coupler 14, the optical waveguides 18a, 18b having the same optical path length, and the 3 dB optical coupler 16 realizes the optical filter mechanism for separating signal light amplified by the SOAs 24a, 34b from control light, as in the optical amplifying device according to the first embodiment.

The signal light outputted from the output port H is outputted from the other end of the optical waveguide 26b. On the other hand, the control light outputted from the input port B is outputted from the other end of the optical waveguide 20b.

Thus, signal light inputted into the optical waveguide 20a is amplified, and the amplified signal light is outputted from the other end of the optical waveguide 26b, spatially separated from the control light.

As described above, according to the present embodiment, signal light and control light are caused to propagate in the SOAs in directions opposite to each other, whereby the generation of the phase conjugate waves due to the FWM in the SOAs 24a, 24b can be prevented. Accordingly, in order to remove the phase conjugate waves mixed in signal light, this makes it unnecessary to provide the wavelength filter, the wavelength meter, the control unit, etc. as included in the optical amplifying device according to the second and the third embodiments, which can make the device smaller-sized and decrease the cost.

In the optical amplifying device according to the present embodiment, signal light and control light are caused to propagate in the SOAs in the directions opposite to each other to thereby prevent the generation of the phase conjugate waves, whereby the prevention of the generation of the phase conjugate waves is not restricted by the wavelength of the control light, as is in the optical amplifying device according to the third embodiment. In other words, the wavelength of control light can be set at high freedom degree. Control light, the wavelength of which can be set at high freedom degree, can be set to provide sufficient gain saturation at low power. This permits the device length of the DFB laser 22 as the light source for control light to be short, which makes the electric power consumption low. This point will be detailed below.

Usually, SOAs are designed to provide sufficient gains with a wavelength $\lambda_s$ of signal light. Accordingly, when a wavelength $\lambda_c$ of control light is largely estranged from a wavelength $\lambda_s$ of signal light, the gains of the SOAs with respect to the control light is decreased. In such case, in order to sufficiently induce the gain saturation of the SOAs control light of very high power is required, and to this end, the device length of the DFB laser as the light source for control light must be large, and the power consumption is also large.

FIG. 11 is a graph of the dependency of gain change amounts $\Delta G$, with which the gain of signal light can be varied when control light of a certain power is injected, on the wavelength $\lambda_c$ of control light. In this case, the power of the inputted signal light is −3 dBm, and the wavelength $\lambda_s$ of the signal light is 1560 nm.

When the power of the control light is +3 dBm as shown by the dotted line in FIG. 11, the gain change amount $\Delta G$ becomes the maximum value of 6 dB when the wavelength $\lambda_c$ of the control light is 1540 nm. When the wavelength $\lambda_c$ of the control light is 1500 nm, the gain change amount $\Delta G$ is decreased to 4 dB. When the wavelength $\lambda_c$ of the control light is 1590 nm, the gain change amount $\Delta G$ is decreased to 2 dB.

On the other hand, when the power of the control light is +6 dBm as shown by the solid line in FIG. 11, the gain change amount $\Delta G$ becomes the maximum value of 8 dB when the wavelength $\lambda_c$ of the control light is 1550 nm. When the wavelength $\lambda_c$ of the control light is 1500 nm, the gain change amount $\Delta G$ is decreased to 5.5 dB.

FIG. 12 is a graph of the dependency of the power of control light required to retain the output level of signal light at a constant value of +10 dBm on the wavelength $\lambda_c$ of control light. In this case as well, as in the graph of FIG. 11, the power of signal light to be inputted is −3 dBm, and the wavelength $\lambda_s$ of the signal light is 1560 nm.

As seen in the graph of FIG. 12, the power of the control light required when the wavelength $\lambda_c$ of the control light is 1540 nm is +2.9 dBm. The power of the control light required when the wavelength $\lambda_c$ of the control light is 1500 nm is +6.6 dBm, which is twice or more times the power of control light required when the wavelength $\lambda_c$ is 1540 nm.

The optical amplifying device according to the present embodiment can prevent the generation of the phase conjugate waves due to the FWM in the SOAs without being restricted by the wavelength of control light, whereby the wavelength of control light can be set with high freedom degree. Accordingly, the wavelength of control light can be set so that the gain change amount $\Delta G$ can be as large as possible and the power of control light required to amplify signal light to a prescribed level can be as low as possible. Thus, the wavelength of control light can be set so as to gain sufficient gain saturation at low power, whereby the device length of the DFB laser 22 as the light source for control light can be short, and the power consumption can be made small.

(Modified Embodiments)

The present invention is not limited to the above-described embodiment and can cover other various modifications.

For example, in the above-described embodiment, materials of the optical amplifying device are of InGaAsP/InP group. However, the materials are not limited to InGaAsP/InP group, and other groups, as of InAlGaAs/InP group, etc., may be used. The film thickness, compositions, etc. of the respective layers can be suitably changed.

In the above-described embodiment, the DFB laser 22 is used as the light source for control light. However, the light source for control light is not limited to the DFB laser 22 as long as the light source for control light can be formed together with the rest constituent elements on one and the same substrate. For example, a semiconductor laser, such as a Distributed Bragg Reflector (DBR) laser or others, other than the DFB laser 22 can be used as the light source for control light.

INDUSTRIAL APPLICABILITY

The present invention is suitable for optical amplifying devices, and more specifically useful for optical amplifying devices having the function of controlling the light output level, which can decrease the number of necessary optical parts, can be small-sized, and can decrease the electric power consumption.

The invention claimed is:

1. An optical amplifying device for controlling an amplification factor of signal light by using control light, comprising:
    a light source for control light formed on a semiconductor substrate, for outputting the control light;
    a coupling part formed on the semiconductor substrate, for coupling the signal light and the control light;
    a semiconductor optical amplifier formed on the semiconductor substrate, for amplifying the signal light and the control light, both being coupled with each other; and
    a separating part formed on the semiconductor substrate, for separating the signal light amplified by the semiconductor optical amplifier from the control light to output the amplified signal light.

2. An optical amplifying device according to claim 1, wherein the coupling part inputs the signal light and the control light into the semiconductor optical amplifier in directions opposite to each other to couple the signal light and the control light in the semiconductor optical amplifier, and the separating part separates the signal light and the control light from each other, which have propagated in the semiconductor optical amplifier in the directions opposite to each other.

3. An optical amplifying device comprising:
a symmetric Mach-Zehnder interferometer formed on a semiconductor substrate, and including a first 3 dB optical coupler and a second 3 dB optical coupler each having 2 input ports and 2 output ports, and a first optical waveguide and a second optical waveguide optically interconnecting the output ports of the first 3 dB optical coupler and the input ports of the second 3 dB optical coupler;
semiconductor optical amplifiers respectively formed in the first and the second optical waveguides;
a light source for control light formed on the semiconductor substrate, for inputting control light into the symmetric Mach-Zehnder interferometer via the first or the second 3 dB optical coupler to make the control light propagate in the respective semiconductor optical amplifiers, a light level of the control light being controlled for controlling an amplification factor for signal light inputted into one input port of the first 3 dB optical coupler, the signal light being amplified by the respective semiconductor optical amplifiers; and
a control part which controls a light level of the control light to be outputted from the light source for control light based on a light level of the signal light to be amplified by the semiconductor optical amplifier, to control a light level of the signal light amplified by the semiconductor optical amplifier substantially constant.

4. An optical amplifying device according to claim 3, wherein the light source for control light inputs the control light into the other input port of the first 3 dB optical coupler, and the amplified signal light is outputted from the output port of the second 3 dB optical coupler which is the cross port with respect to said input port, into which the signal light has been inputted.

5. An optical amplifying device according to claim 3, wherein the light source for control light inputs the control light into the Mach-Zehnder interferometer at that of the output ports of the second 3 dB optical coupler, which is different from the output port thereof, from which the signal light is outputted, and the amplified signal light is outputted from the other output port of the second 3 dB optical coupler, which is a cross port with respect to said input port, into which the signal light has been inputted.

6. An optical amplifying device according to claim 4, further comprising a wavelength filter disposed downstream of said output port from which the amplified signal light is outputted, for removing a phase conjugate wave generated in the semiconductor optical amplifiers due to four wave mixing.

7. An optical amplifying device comprising:
a symmetric Mach-Zehnder interferometer formed on a semiconductor substrate, and including a first 3 dB optical coupler and a second 3 dB optical coupler each having 2 input ports and 2 output ports, and a first optical waveguide and a second optical waveguide optically interconnecting the output ports of the first 3 dB optical coupler and the input ports of the second 3 dB optical coupler;
semiconductor optical amplifiers respectively formed in the first and the second optical waveguides;
a light source for control light formed on the semiconductor substrate, for inputting control light into the symmetric Mach-Zehnder interferometer via the first or the second 3 dB optical coupler to make the control light propagate in the respective semiconductor optical amplifiers, a light level of the control light being controlled for controlling an amplification factor for signal light inputted into one input port of the first 3 dB optical coupler, the signal light being amplified by the respective semiconductor optical amplifiers, wherein the light source for control light inputs the control light into the other input port of the first 3 dB optical coupler, and wherein the amplified signal light is outputted from the output port of the second 3 dB optical coupler which is the cross port with respect to said input port, into which the signal light has been inputted, the device further comprising:
a wavelength filter disposed downstream of said output port from which the amplified signal light is outputted, for removing a phase conjugate wave generated in the semiconductor optical amplifiers due to four wave mixing, the wavelength filter being wavelength tunable filter a transmission band of which is tunable;
a wavelength measuring part for measuring the wavelength of the signal light; and a control part for controlling the transmission band of the wavelength filter, based on a measured result given by the wavelength measuring part.

8. An optical amplifying device according to claim 6, wherein the wavelength filter is a wavelength filter having a transmission band containing a plurality of wavelengths of the signal light.

9. An optical amplifying device according to claim 1, further comprising a control part which controls a light level of the control light to be outputted from the light source for control light based on a light level of the signal light to be amplified by the semiconductor optical amplifier, to control a light level of the signal light amplified by the semiconductor optical amplifier substantially constant.

10. An optical amplifying device according to claim 2, further comprising a control part which controls a light level of the control light to be outputted from the light source for control light based on a light level of the signal light to be amplified by the semiconductor optical amplifier, to control a light level of the signal light amplified by the semiconductor optical amplifier substantially constant.

11. An optical amplifying device according to claim 1, wherein the light source for control light is a distributed feedback semiconductor laser.

12. An optical amplifying device according to claim 2, wherein the light source for control light is a distributed feedback semiconductor laser.

13. An optical amplifying device according to claim 3, wherein the light source for control light is a distributed feedback semiconductor laser.

14. An optical amplifying device according to claim 1, wherein the semiconductor optical amplifier is a polarization independent optical amplifier, in which a gain given to the signal light is substantially constant independent of a polarized state of the signal light.

15. An optical amplifying device according to claim 2, wherein the semiconductor optical amplifier is a polarization independent optical amplifier, in which a gain given to the signal light is substantially constant independent of a polarized state of the signal light.

16. An optical amplifying device comprising:
a symmetric Mach-Zehnder interferometer formed on a semiconductor substrate, and including a first 3 dB optical coupler and a second 3 dB optical coupler each having 2 input ports and 2 output ports, and a first optical waveguide and a second optical waveguide optically interconnecting the output ports of the first 3 db optical coupler and the input ports of the second 3 dB optical coupler;

semiconductor optical amplifiers respectively formed in the first and the second optical waveguides;

a light source for control light formed on the semiconductor substrate, for inputting control light into the symmetric Mach-Zehnder interferometer via the first or the second 3 dB optical coupler to make the control light propagate in the respective semiconductor optical amplifiers, a light level of the control light being controlled for controlling an amplification factor for signal light inputted into one input port of the first 3 dB optical coupler, the signal light being amplified by the respective semiconductor optical amplifiers, the semiconductor optical amplifier being a polarization independent optical amplifier, in which a gain given to the signal light is substantially constant independent of a polarized state of the signal light.

* * * * *